United States Patent
Li

(10) Patent No.: US 12,362,193 B2
(45) Date of Patent: Jul. 15, 2025

(54) NEED FOR SI3N4 SELECTIVE REMOVAL BY WET CHEMISTRY

(71) Applicant: Weimin Li, New Milford, CT (US)

(72) Inventor: Weimin Li, New Milford, CT (US)

(73) Assignee: SHANGHAI INSTITUTE OF IC MATERIALS, Shanghai (CN)

( * ) Notice: Subject to any disclaimer, the term of this patent is extended or adjusted under 35 U.S.C. 154(b) by 365 days.

(21) Appl. No.: 17/445,560

(22) Filed: Aug. 20, 2021

(65) Prior Publication Data

US 2021/0384037 A1    Dec. 9, 2021

Related U.S. Application Data

(63) Continuation of application No. PCT/US2020/019097, filed on Feb. 20, 2020.

(51) Int. Cl.
  *H01L 21/311* (2006.01)
  *H01L 21/67* (2006.01)
  *H10B 69/00* (2023.01)

(52) U.S. Cl.
  CPC .. *H01L 21/31111* (2013.01); *H01L 21/67075* (2013.01); *H10B 69/00* (2023.02)

(58) Field of Classification Search
  CPC ......... H01L 21/31111; H01L 21/67075; H01L 21/67069; H01L 21/02164; H01L 21/0217; H01L 21/67253; H10B 69/00; B01D 21/0012; B01D 21/01
  See application file for complete search history.

(56) References Cited

U.S. PATENT DOCUMENTS

| | | | |
|---|---|---|---|
| 4,092,211 A | | 5/1978 | Morris |
| 5,470,421 A | * | 11/1995 | Nakada ............ H01L 21/67086 210/753 |
| 8,105,851 B1 | * | 1/2012 | Ku .................... H01L 21/31111 216/84 |
| 2004/0200806 A1 | | 10/2004 | Izuta et al. |

(Continued)

FOREIGN PATENT DOCUMENTS

| JP | 2006-278409 A1 | 3/2005 |
|---|---|---|
| JP | 2006-310529 A1 | 4/2005 |

(Continued)

OTHER PUBLICATIONS

Weimin Li; "Need for Si3N4 Selective Removal by Wet Chemistry", Weimin Li Proprietary Information Feb. 1, 2019.

(Continued)

*Primary Examiner* — Duy Vu N Deo
*Assistant Examiner* — Christopher Remavege
(74) *Attorney, Agent, or Firm* — IPRTOP LLC

(57) ABSTRACT

A system for processing a substrate and a method for processing a substrate are disclosed. The system for processing a substrate includes a processing chamber configured to receive the substrate, wherein the substrate is exposed to an etchant in the processing chamber to remove a portion of the substrate and generate access to the substrate. A by-product in the etching solution; and a by-product removing section configured to convert the by-product into a precipitate and remove the precipitate, thereby removing the by-product. The Etching solution is circulated back to the processing chamber after the by-product is removed.

12 Claims, 6 Drawing Sheets

S101 — Introducing an etchant into a process chamber to remove a portion of the semiconductor device structure and generating a by-product S102 — Converting the by-product into a precipitate; and removing the precipitate therby removing the by-product continuously

(56) References Cited

U.S. PATENT DOCUMENTS

| | | | | |
|---|---|---|---|---|
| 2007/0102023 | A1* | 5/2007 | Yi | B08B 3/14 |
| | | | | 134/108 |
| 2009/0101626 | A1 | 4/2009 | Arndt et al. | |
| 2010/0022096 | A1 | 1/2010 | Li et al. | |
| 2010/0176082 | A1* | 7/2010 | Cooper | H01L 21/0206 |
| | | | | 252/79.3 |
| 2014/0290859 | A1* | 10/2014 | Kobayashi | H01L 21/67017 |
| | | | | 156/345.15 |
| 2015/0111390 | A1 | 4/2015 | Changchien et al. | |
| 2015/0380323 | A1* | 12/2015 | Yang | H01L 21/67253 |
| | | | | 438/8 |
| 2018/0090340 | A1* | 3/2018 | Sugioka | H01L 22/20 |
| 2019/0099694 | A1* | 4/2019 | Fan | H01L 21/67017 |
| 2020/0157423 | A1* | 5/2020 | Bilodeau | C23F 1/14 |

FOREIGN PATENT DOCUMENTS

| | | | |
|---|---|---|---|
| JP | 2010-263053 | A1 | 5/2009 |
| KR | 20180029115 | * | 3/2018 |

OTHER PUBLICATIONS

Weimin Li; "Prior Art to Remove Si3N4 selectively to SiO2 by Using Phosphoric Acid based Chemistry", Weimin Li Proprietary Information Feb. 1, 2019.

Dongwan Seo, et al; "Selective wet etching of $Si_3N_4/SiO_2$ in phosphoric acid with the addition of fluoride and silicic com-pounds", Microelectronic Engineering; vol. 118, Apr. 25, 2014, pp. 66-71.

Seunghoon Lee; et al. "A Study on $Si_3N_4$ and Additives by Using Wafer Direct Heating", New Physics: Sae Mulli, vol. 68, No. 8, Aug. 2018; pp. 852-856; http://dx.doi.org/10.3938/NPSM.68.852.

Summary of prior art; Weimin Li Proprietary Information Feb. 1, 2019.

Embodiments of Currant Invention-Weimin Li Proprietary Information Feb. 1, 2019.

The International Search Report mailed Jul. 15, 2020; PCT/US2020/19097.

Arwa Abbas; "Nanofabrication Using Electron Beam Lithography: Novel Resist and Applications", A thesis presented to the University of Waterloo in fulfillment of the thesis requirement for the degree of Master of Applied Science in Mechanical Engineering-Nnotechnolgy. 73 pages; Waterloo, Ontario, Canada, 2013.

Ying-Hsueh Chang Chien, et al; "A Design for Selective Wet Etching of $Si_3N_4/SiO_2$ in Phosphoric Acid Using a Single Wafer Processor", Journal of The Electrochemical Society, vol. 165(4); H3187-H3191: Published Mar. 22, 2018.

The Written Opinion of the International Searching Authority mailed Jul. 15, 2020; PCT/US2020/19097.

The PCT search report and written opinion dated Jul. 15, 2020; Appln. No. PCT/US2020/019097.

Search report and Written opinion by Intellectual property office of Singapore dated Jul. 4, 2023, Appln. No. 11202109069W.

Abbas Nanofabrication Using Electron Beam Lithography: Novel Resist and Applications 2013 MS thesis, University of Waterloo, Entirety of document especially p. 3, para 3, fig. 1-1.

* cited by examiner

NEED FOR SI3N4 SELECTIVE REMOVAL BY WET CHEMISTRY

RELATED APPLICATIONS

This application is bypass continuation of PCT/US2020/019097, filed on Feb. 20, 2020, which claims priority to and benefit from U.S. Provisional Application No. 62/808,046, filed on Feb. 20, 2019, which is hereby incorporated by reference herein in its entirety.

TECHNICAL FIELD

The present disclosure relates generally to semiconductor design and fabrication. Specifically, the invention relates to methods for removing dielectric layers from integrated circuit devices.

BACKGROUND

Integrated circuits are the foundation of the information industry. The development and application of 5G, artificial intelligence, Internet of Things, autonomous driving and other technologies all rely on integrated circuits such as processors and memories. The pursuit of higher performance and lower cost integrated circuits has led to higher integrated density integrated circuits. This poses challenges for various semiconductor manufacturing equipment such as wet etching equipment.

During manufacture of integrated circuit (IC) devices, dielectric layers are often used to aid the fabrication process. After aiding the fabrication process, the silicon nitride layer must be removed.

Several processes are known to remove silicon nitride layers from IC devices which are selective to silicon oxide, i.e., removing silicon nitride without appreciably attack the silicon oxide. In one removal process, a substrate containing the silicon nitride layer is dipped in high-temperature (100° C.) water. Other removal processes use phosphoric acid ($H_3PO_4$). At low temperatures, phosphoric acid is unable to significantly etch the silicon nitride because of its inability to appreciably attack the silicon nitride. Higher temperatures speed up not only the etch rate of the silicon nitride, but also the attack of the silicon oxide. As a result, it has been difficult to etch a silicon nitride structure using phosphoric acid.

With the growth of 3D-NAND, as shown in FIG. 2, there is a large amount of silicon nitride ($Si_3N_4$) being etched from the substrate and dissolved into $H_3PO_4$ solution. The high concentration silicon in $H_3PO_4$, usually in the form of silicic acid, reduces the etch rate of $Si_3N_4$. In 3D-NAND manufacturing, it is necessary to replace etching solution with fresh $H_3PO_4$ after processing a limited number of wafers, results in very high production cost. Certain proposals have been raised to remove silicon in $H_3PO_4$ in order to extend the number of 3D-NAND wafers processed between batches of $H_3PO_4$ solutions. E.g., Izuta proposed to dilute the processed $H_3PO_4$ with $H_2O$ up to 50% and lower the temperature to as low as room temperature in order to precipitate silicon. In another example, Izuta proposed to use a complicated filter network after adding water to the $H_3PO_4$ in order to remove the silicon precipitation. However, since the equilibrium concentration of $H_2O$ in $H_3PO_4$ at 160-180 C is about 22%. Adding more $H_2O$ to $H_3PO_4$ will not only reduce the $Si_3N_4$ etch rate, but also lower the $H_3PO_4$ temperature. Before the treated $H_3PO_4$ is re-introduced into the process tank, it has to be heated to 160-180 C and evaporate all extra $H_2O$ that exceeds the equilibrium concentration. Thus the methods proposed by Izuta cannot be efficiently used in the mass production, which in fact have not been.

In view of the foregoing, a need exists for an efficient or cost effective method of selectively removing silicon nitride.

SUMMARY

According to a first aspect, a method for removing dielectric materials from a semiconductor device structure may comprise a processing chamber and a by-product removal section. The processing chamber may be configured to receive the semiconductor device structure. The semiconductor device structure may be exposed to an etchant in the processing chamber to remove a portion of the structure and generate a by-product that enters the etchant. The by-product removal section may be configured to convert the by-product into a precipitate and remove the precipitate, thereby removing the by-product continuously.

In certain aspects, the by-product removal section comprises a precipitation accelerator supply portion.

In certain aspects, the precipitation accelerator supply portion comprises a filter, which is configured to remove the precipitate.

In certain aspects, the by-product removal section further comprises a precipitation chamber provided on an upstream side of the filter. The precipitation accelerator supply portion is configured to supply the precipitation accelerator to the precipitation chamber.

In certain aspects, the system comprises an etchant processing section. The etchant processing section is configured to prepare the etchant.

In certain aspects, the etchant processing section is configured to store the etchant.

In certain aspects, the etchant processing section comprises a chemical agent supply section for supplying a chemical agent.

In certain aspects, the etchant processing section comprises a cavity for mixing and storing the chemical agent.

In certain aspects, the filter has a diameter no more than about 0.22 micrometer, for example.

According to a second aspect, a method of for removing dielectric materials from a semiconductor device structure comprises steps of introducing an etchant into a processing chamber to remove a portion of the semiconductor device structure and generating a by-product; converting the by-product into a precipitate; and removing the precipitate, thereby removing the by-product continuously.

In certain aspects, converting the by-products into the precipitate comprises the step of supplying a precipitation accelerator to the etchant.

In certain aspects, the removing the precipitate comprises filtering out the precipitate.

In certain aspects, the etchant comprises a phosphoric acid-containing solution.

In certain aspects, the portion of the substrate comprises silicon nitride.

In certain aspects, the by-products include silicic acid.

In certain aspects, the precipitation accelerator comprises one or more of the following: hydrogen fluoride, water, amino acid, amine, or inorganic salt containing Ca, or Mg and the like.

In certain aspects, the precipitation accelerator causes the by-products to precipitate on the precipitation accelerator. The precipitation accelerator comprises one or more of the following: molecular sieve, silicate power, quartz, or siloxane.

In certain aspects, the by-products concentration is monitored in real time.

In certain aspects, the precipitation accelerator is introduced in proportion.

In certain aspects, the precipitation accelerator is introduced in an amount other than in proportion.

In certain aspects, the precipitation accelerator causes a change of the by-products temperature, either higher or lower.

According to a third aspect, a method for removing a dielectric material from a semiconductor device structure comprises steps of exposing a semiconductor device structure to a solution exhibiting a positive etch selectivity for the dielectric materials, such as silicon nitride; and removing the dielectric materials chemically from the semiconductor device structure in such a way that the solution exhibits negative etch selectivity for silicon oxide.

In certain aspects, the method further comprises converting the silicon nitride to a by-product.

In certain aspects, the method further comprises converting the by-product to a precipitate.

In certain aspects, the method further comprises removing the precipitate from the solution.

In certain aspects, the method further comprises monitoring composition of the solution in real time.

According to a second aspect, the method of removing the by-product through precipitation does not significantly lower the temperature of the etchant.

DESCRIPTION OF THE DRAWINGS

These and other advantages of the present invention may be readily understood with the reference to the following specifications and attached drawings wherein.

DETAILED DESCRIPTION

Figure 1:
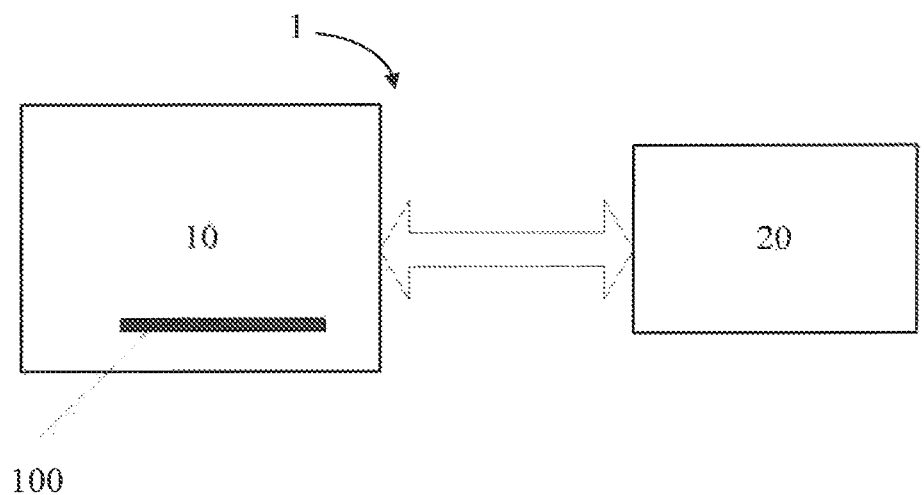
FIG. 1 illustrates a system for processing a substrate according to an embodiment of the present disclosure.

Preferred embodiments of the present disclosure may be described hereinbelow with reference to the accompanying drawings. In the following description, well-known functions or constructions are not described in detail because they may obscure the disclosure in unnecessary detail. For this disclosure, the following terms and definitions shall apply.

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

The process steps described below may not form a complete process flow for manufacturing IC devices. Only the process steps necessary to understand the present invention are disclosed.

Wet etching technology is one of the key technologies of semiconductor manufacturing technology. When the substrate is etched, in order to precisely control the etching rate and obtain the etch selectivity for specific materials, in addition to meeting reaction process conditions such as temperature, it is usually necessary to maintain the content or concentration of various components in the etchant or etching solution within the range of error. For example, on one hand, as the etching reaction progresses, the active ingredients in the etching solution may be gradually consumed. Therefore, it is necessary to monitor the composition of the etching solution in real time and replenish the consumed active ingredients in time. On the other hand, the etching reaction will produce various etching by-products. If these by-products cannot be removed on time, these by-products can have a potential adverse effect on the etching process. Unfortunately, the current design efforts for wet etching equipment are mainly focused on the former, the latter has not received sufficient attention. This causes the related etching equipment generally lack the ability to remove etching by-products. However, with the increasing integration and complexity of integrated circuits, the lack of this capability will not only reduce the recycling rate of the etching solution, but also make it difficult to form very fine semiconductor device structures.

In particular, current NAND memories are generally constructed with a 3D structure. The key steps for forming the 3D structure include: forming a stack consisting of alternately stacked silicon nitride layers and silicon dioxide layers on a semiconductor substrate such as silicon. A trench is formed through the stack by a dry etching technique to reach the substrate. Constructions of 3D NAND are referred to in the U.S. patent application Ser. No. 16/517,600, filed Jul. 21, 2019, which claims priority to and benefit from a PCT application No. PCT/US18/14408, which was filed on Jan. 19, 2018, which claims priority to and benefit from a U.S. Provisional Application No. 62/448,677, filed on Jan. 20, 2017. Constructions of 3D Ferroelectric Oxide Memory Devices are referred to in the U.S. patent application Ser. No. 16/517,598, which claims priority to and benefit from a PCT application No. PCT/US18/14416, which was filed on Jan. 19, 2018, which claims U.S. Provisional Application No. 62/448,677, filed on Jan. 20, 2017. The foregoing applications, owned in common with the present application and incorporated herein by reference in their entirety.

The silicon nitride material layer is selectively removed by an etching solution using phosphoric acid as the main etchant, specifically, the silicon nitride layer in the stack is exposed to the etchant through the trench formed in the stack and the silicon nitride is thereby removed. For 3D NAND memories, the main method to increase storage density is to increase the number of layers in the 3D structure, that is, the number of silicon nitride layers and silicon dioxide layers. However, an increase in the number of silicon nitride layers and silicon dioxide layers means not only an increase in the amount of silicon nitride to be removed, but also an increased etch depth caused by an increased aspect ratio. In this case, the effects of etching by-products cannot be ignored. The main etching by-product formed by etching silicon nitride with a phosphoric acid solution is silicic acid, which exists in the form of orthosilicic acid ($Si(OH)_4$) and phosphoric acid solution. The inventors have found in practice that as the number of layers of the 3D structure increases, orthosilicic acid entering (e.g., dissolving) in the phosphoric acid solution is more likely to polymerize and eventually precipitate beyond its solubility limit during the etching process. This phenomenon can prevent further silicon nitride etching and even cause particle contamination on the surface of the structure, making it difficult to form the desired high aspect ratio structure. Currently, the related art etching equipment cannot solve or alleviate the above problems.

Embodiments of the present disclosure will be described below with reference to the drawings.

FIG. 1 illustrates a system 1 for processing a substrate according to an embodiment of the present disclosure. As shown in FIG. 1, the system 1 for processing a substrate includes a processing chamber 10 and a by-product removal section 20. The processing chamber 10 is configured to receive a substrate 100 in which the substrate 100 is exposed to an etchant to remove a portion of the substrate 100 and generate by-products that enter (e.g., dissolve, etc.) into the etchant. The by-product removal section 20 is configured to convert the generated by-product into a precipitate and remove the precipitate, thereby removing the by-product.

With the above system, it is possible to remove or reduce the etching by-products with potentially adverse effects in the etching solution in time during the etching process, thereby ensuring that the etching process can be performed well. As mentioned above, this is particularly important for the selective removal of silicon nitride during the manufacture of 3D NAND memories. According to an embodiment of the present disclosure, the etchant may include a phosphoric acid solution. The removed portion of the substrate 100 includes silicon nitride.

Figure 2:
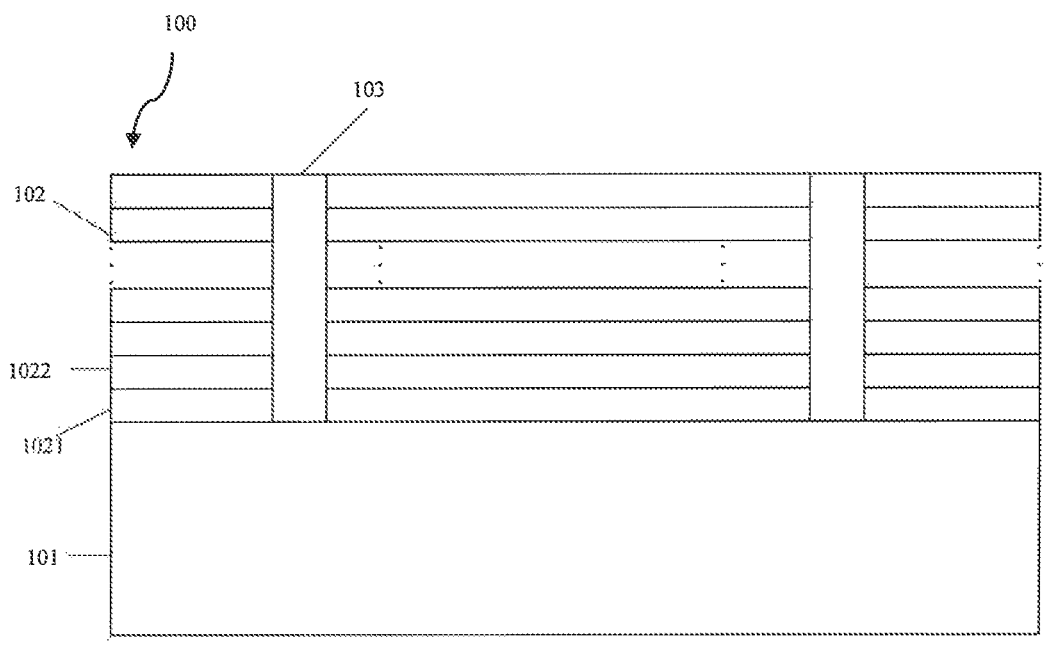
FIG. 2 illustrates a cross-sectional view of a substrate to be processed according to an embodiment of the present disclosure.

FIG. 2 illustrates a cross-sectional view of a substrate 100 to be processed according to an embodiment of the present disclosure. The substrate 100 is particularly suitable for manufacturing a 3D NAND memory. As shown in FIG. 2, the substrate 100 may include a substrate 101 (for example, a silicon substrate) and a stack 102 on the substrate 101. The stack 102 includes a silicon dioxide layer 1021 and a silicon nitride layer 1022 alternately stacked on a substrate 101. The substrate 100 also includes a hole 103 extending through the stack 102. During the etching process, the substrate 100 is disposed in the processing chamber 10 and is exposed to an etchant or etching solution which enters the holes 103 and thereby removes each silicon nitride layer 1022 in the stack 102.

Figure 3:
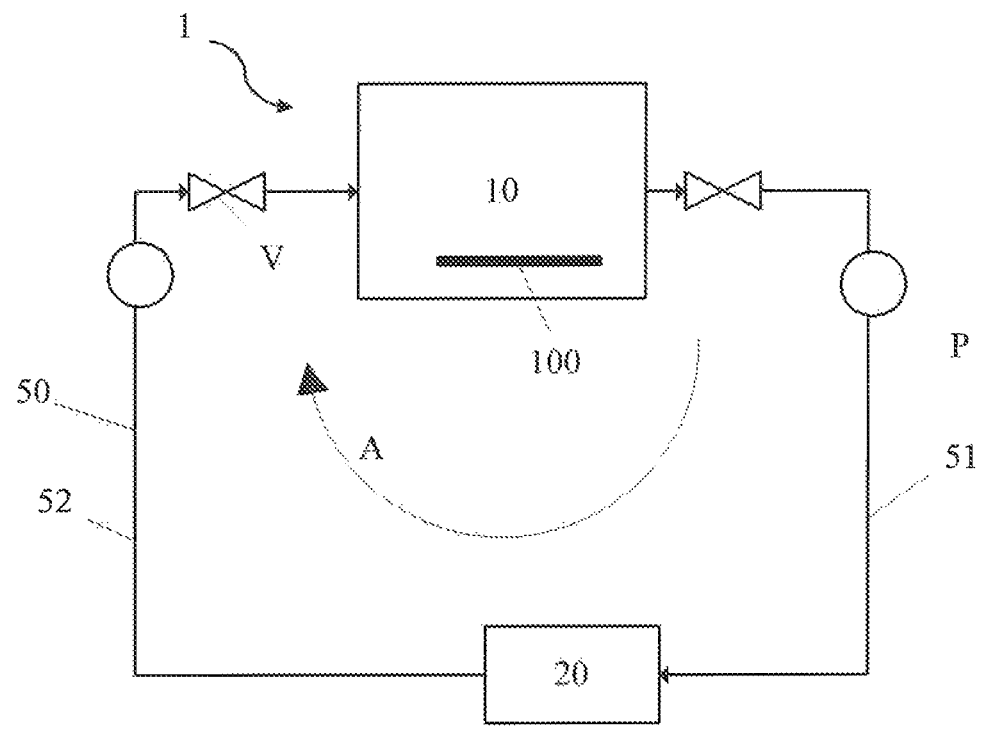
FIG. 3 illustrates a system for processing a substrate according to an embodiment of the present disclosure.

FIG. 3 illustrates a system for processing a substrate according to an embodiment of the present disclosure. As shown in FIG. 3, the processing chamber 10 and the by-product removal section 20 are provided in a first circulation line 50 for circulating the etching solution in the first circulation direction A. The first circulation line 50 includes a first line 51 and a second line 52. The first line 51 may be configured to guide the etching solution from the processing chamber 10 to the by-product removal portion 20, and the second line 52 is configured to transfer the etchant back to the processing chamber 10 from the by-product removal section 20. With this system configuration, the etchant can be circulated between the processing chamber 10 and the by-product removal section 20, and thus can be recycled, which increases processing capacity and material utilization. In addition, as shown in FIG. 3, a pump P and a valve V are provided in the new circulation circuit 50 according to actual needs to control the flow and the flow rate of the etching solution. It should be understood that other additional devices (not shown), such as heating gas, various sensors, pressure gauges, etc., may also be provided in the first circulation line 50, which is not limited in the embodiments of the present disclosure.

Figure 4:
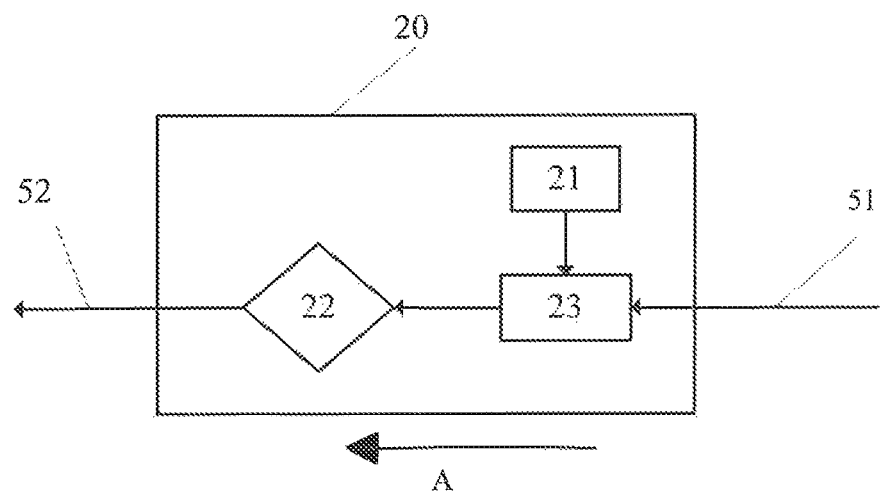
FIG. 4 illustrates a by-product removal section according to an embodiment of the present invention.

FIG. 4 illustrates a by-product removal section according to an embodiment of the present invention. As shown in FIG. 4, the by-product removal section 20 includes a precipitation accelerator supply section 21 and a filter 22. The precipitation accelerator supply section 21 is configured to supply to the upstream side of the filter 22, for example, in the first circulation direction A, a precipitation accelerator for converting an etching by-product into precipitation. The filter 22 is configured to remove the generated precipitate.

In the case where the etchant is a phosphoric acid solution and the material layer to be etched is a silicon nitride layer, as described above, the etching by-product that is prone to form a precipitate is silicic acid, which exists in the form of orthosilicic acid in the phosphoric acid solution. Accordingly, the precipitation promoter may include at least one of the following: hydrogen fluoride, amino acids, amines, inorganic salts containing Ca, Mg, and the like. For example, when the precipitation promoter is hydrogen fluoride, the reaction that generates precipitation is expressed by the following formula:

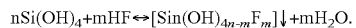

$$nSi(OH)_4 + mHF \leftrightarrow [Sin(OH)_{4n-m}F_m]\downarrow + mH_2O.$$

The precipitation promoter may include a solid structure that causes silicic acid to precipitate on the surface of the solid structure. Such solid structure may include but not limited to $SiO_2$, either in the form of powder or blocks, or a molecular sieve, and the like.

The precipitation promoter may either heat or cool the by-product to accelerate the precipitation. However, the by-product temperature is not significantly lower than the process temperature, and the phosphoric acid concentration does not vary significantly from its equilibrium concentration.

Figure 5:
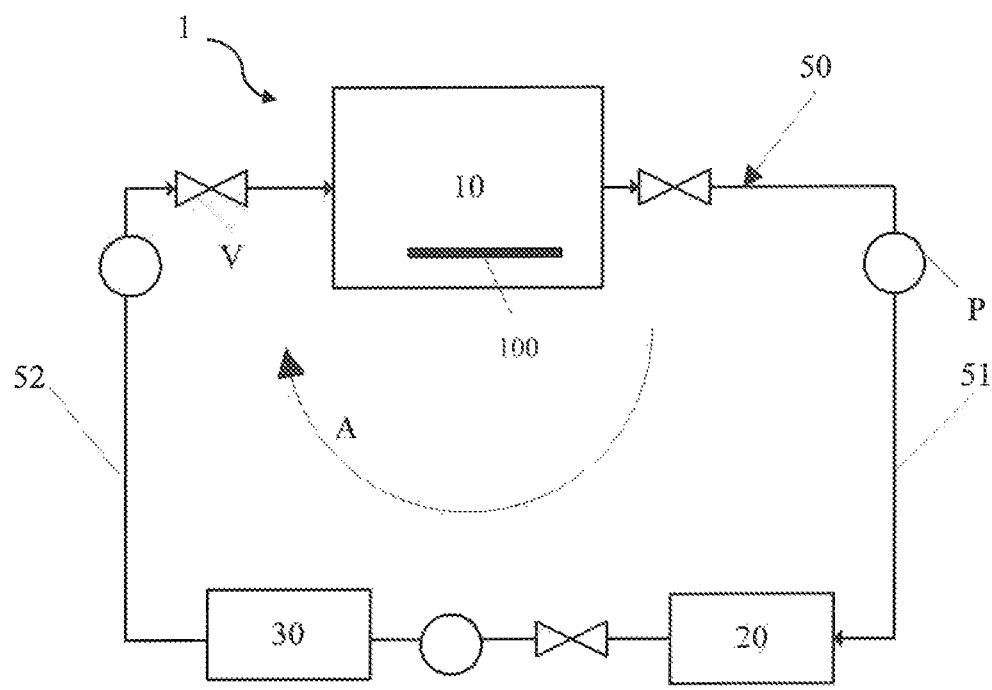
FIG. 5 illustrates a system for processing a substrate according to an embodiment of the present disclosure.

FIG. 5 illustrates a system for processing a substrate according to an embodiment of the present disclosure. As shown in FIG. 5, the system for processing a substrate further includes an etchant processing section 30 connected to the first circulation line 50. The etching solution processing section 30 is configured to achieve at least one of the following functions: 1) preparing and storing an etching solution; 2) supplying the prepared etching solution to a first circulation line; and 3) supplying a chemical agent to the first circulation lines to modulate the etchant. It should be understood that the etching solution processing part 30 may be connected to any suitable position in the first circulation line 50 according to actual needs. Although the etchant processing section 30 is shown as being connected to the second line 52 (i.e., the downstream side of the by-product removal section 20) in FIG. 5, the etchant processing section 30 may be connected to the first line 51 (i.e., upstream side of the by-product removal section). However, considering that the etching by-products and the precipitation accelerator may have a potential influence on the chemicals from the etching solution processing section 30, it is advantageous to connect the etching processing section 30 to the second wiring 52.

Figure 6A:
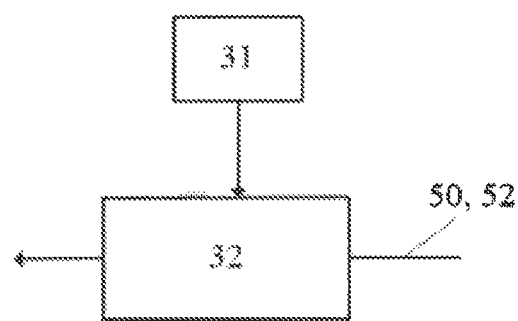
FIG. 6A illustrates an etchant processing section and a connection manner with the first circulation line according to one embodiment of the present invention.
Figure 6B:
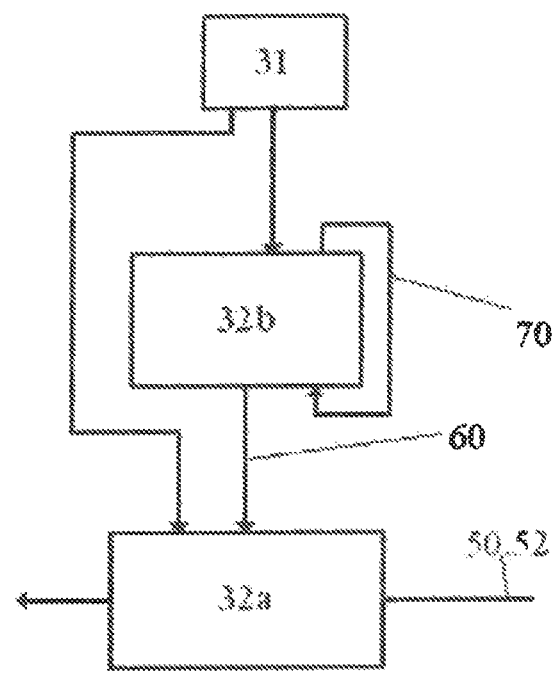
FIG. 6B illustrates an etchant processing section and a connection manner with the first circulation line according to another embodiment of the present invention.
Figure 6C:
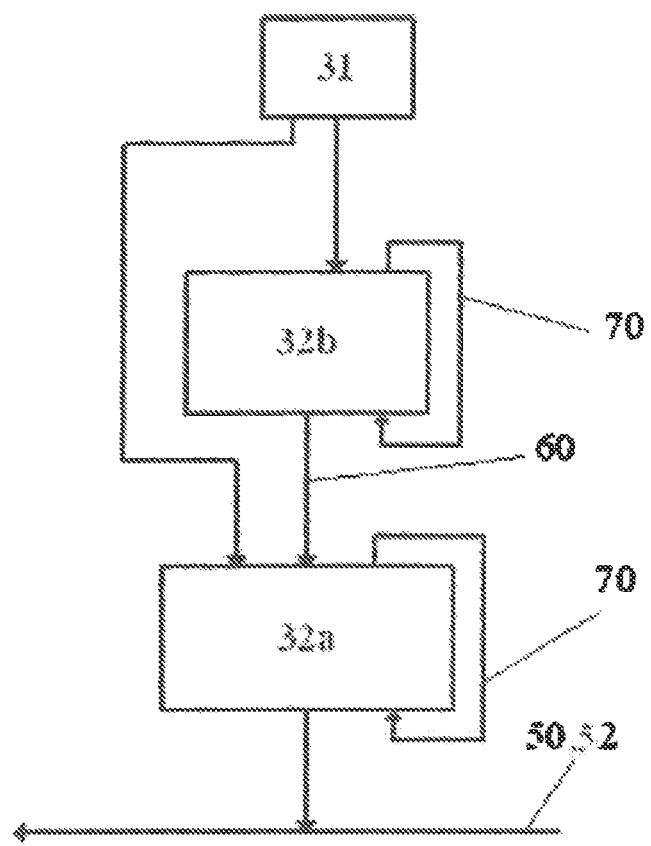
FIG. 6C illustrates an etchant processing section and a connection manner with the first circulation line according to yet another embodiment of the present invention.

FIGS. 6A-6C illustrate an etchant processing unit and a connection manner with the first circulation circuit according to various embodiments of the present invention. As shown in FIGS. 6A-6C, the etchant processing section 30 includes a chemical agent supply section 31 for supplying a chemical agent, and a cavity 32 for mixing and storing the chemical agent. It should be understood that the cavity 32 of the etchant processing portion 30 is not necessary. Without the cavity 32, the chemical agent supply unit 30 may directly supply the chemical agent to the circulation path 50. According to an embodiment of the present disclosure, for etching silicon nitride, the chemical agent provided by the chemical agent supply section 31 may include, but is not limited to, phosphoric acid, water, and various additives. The additive may include, for example, a silicon dioxide etching inhibitor (a silicon compound, such as $H_2SiO_3$, etc.), a silicon nitride etching accelerator (a fluorine compound, such as $NH_4F$, $NH_4HF_2$, and the like). At room temperature, the various additives can be of liquid, solid, or gas.

According to an embodiment of the present disclosure, as shown in FIG. 6A, the cavity 32 may include a cavity provided in the first circulation line 50 (particularly, provided in the second line 52). According to an embodiment of the present disclosure, as shown in FIG. 6B, the cavity 32 includes a first cavity 32a and a second cavity 32b, and the first cavity 32a which is provided with a first circulation line 50 (in particular, a second line 52). The second cavity 32b may be connected to the first cavity 32a and may be provided in a supply line 60 that does not constitute the first circulation line 50. The chemical agent supply portion 31 is configured to extend to the first cavity 32a and the second cavity 32b which at least one of the first cavity 32a or the second cavity 32b provides a chemical agent. According to an embodiment of the present disclosure, the cavity 32 may be provided in the supply line 60 that does not constitute the first circulation line 50. As shown in FIG. 6C, the cavity 32 includes a first cavity 32a and a second cavity 32b which are provided in the supply line 60. The first cavity 32a is connected to the second line 52, and the second cavity 32b is connected to the first cavity 32a. In addition, in FIG. 6C, the chemical agent supply section 31 is configured to supply a chemical agent to at least one of the first cavity 32a and the second cavity 32b. In addition, as shown in FIGS. 6B and 6C, the cavity 32 may have a separate circulation line 70 so that the chemicals supplied into the cavity 32 can be sufficiently stirred and mixed. In addition, the cavity 32 may have a heater and various sensors (not shown).

Figure 7:
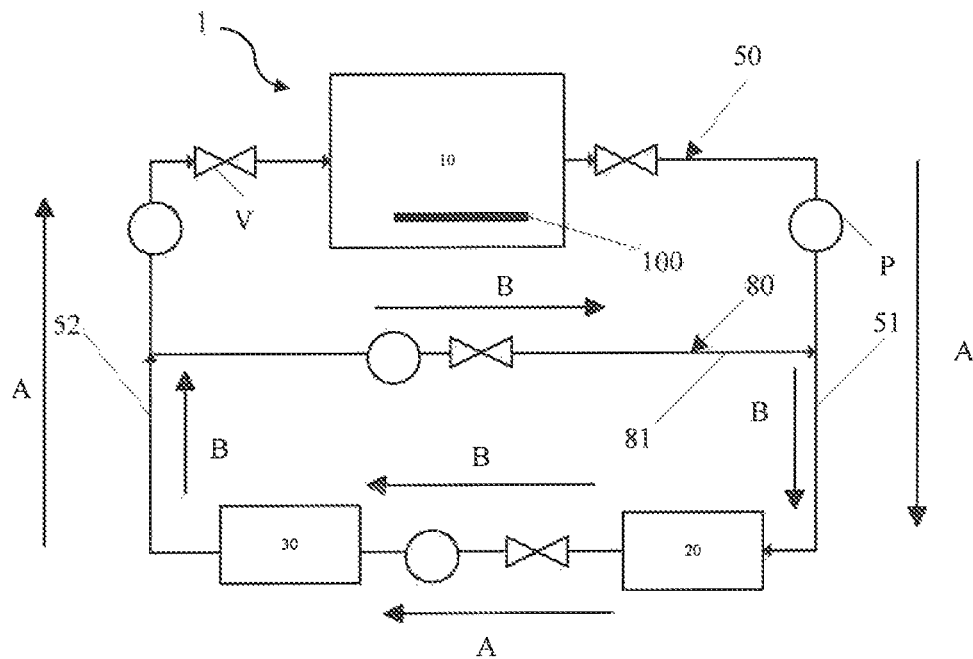
FIG. 7 illustrates a system for processing a substrate according to an embodiment of the present disclosure.

FIG. 7 illustrates a system for processing a substrate according to an embodiment of the present disclosure. As shown in FIG. 7, the system 1 for processing a substrate further includes a third line 81. One end of the third line 81 is connected to the first line 51, and the other end of the third line 81 is connected to a portion of the second line located downstream of the etchant processing unit 30. The third line portion 81 is configured to remove the etchant from the second line. The line 52 leads back to the first line 51. After the third line 81 is introduced, the third line 81, the by-product removal portion 20, and the etchant processing portion 30 may form a second circulation line 80 circulating in the second circulation direction B. This enables the etching solution to be cyclically processed by the by-product removal section 20 and the etching solution processing section 30 before entering the processing chamber 10. With this configuration, the etching solution can be sufficiently processed and stabilized before being introduced into the processing chamber 10.

Figure 8:
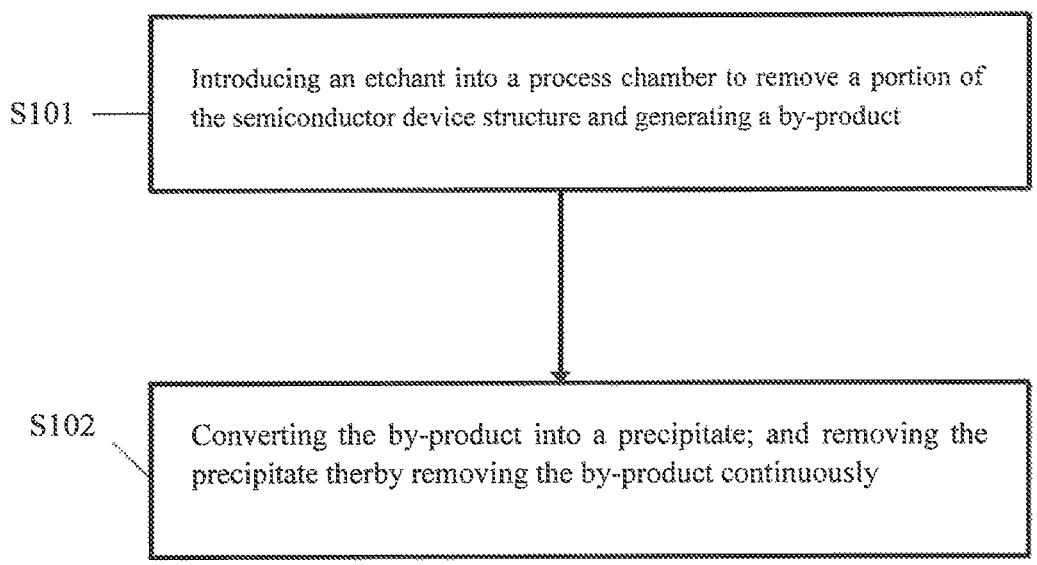
FIG. 8 illustrates a flowchart of a method for processing a substrate according to an embodiment of the present disclosure.

In another aspect of the present disclosure, a method for processing a substrate is provided. FIG. 8 illustrates a flowchart of a method for processing a substrate according to an embodiment of the present disclosure. The method for processing a substrate includes: introducing an etchant solution into a processing chamber to remove a portion of the substrate and generating a by-product entering the etching solution (step S101); and converting the by-product into a precipitate and removing the precipitate, Thereby, the by-product is removed (step S102). According to an embodiment of the present disclosure, converting a by-product into a precipitate includes supplying a precipitation accelerator to an etching solution after use to generate the precipitate. According to an embodiment of the present disclosure, the etching solution includes a phosphoric acid-containing solution, a portion of the substrate includes silicon nitride (such as the silicon nitride layer 1022 in FIG. 2), the by-product includes silicic acid, and the precipitation accelerator includes hydrogen fluoride. Optionally, the method for processing a substrate may further include a step of reintroducing the etchant solution to the process chamber after the by-product's removal.

In further another aspect of the present disclosure, a method for removing dielectric materials from a semiconductor device structure may comprise steps of exposing a semiconductor device structure to a solution exhibiting a positive etch selectivity for silicon nitride; and removing the silicon nitride chemically from the semiconductor device structure in such a way that the solution exhibits negative etch selectivity for silicon oxide.

The method uses an etchant such as acid solution exhibiting a positive etch selectivity or ability to etch one material (i.e., silicon nitride) faster than a second material (i.e., silicon oxide).

A positive etch selectivity means that the acid solution etches dielectric layer (e.g., silicon nitride) at a faster rate than silicon oxide. Preferably, the acid solution employed contains phosphoric acid. The acid solution may contain any concentration of phosphoric acid in water, provided the acid solution exhibits a positive etch selectivity. Preferably, the phosphoric acid concentration ranges from about 50% to about 100%, and is more preferably 85%. The phosphoric acid solution may optionally contain additional agents, such as buffering agents and/or other acids like fluoroboric acid and sulfuric acid.

A negative etch selectivity means that the acid solution etches silicon oxide at a slower rate than a silicon nitride.

The method may further include steps of converting the silicon nitride to a by-product; converting the by-product to a precipitate; removing the precipitate from the solution; and monitoring composition of the solution in real time, as discussed before.

Although various embodiments have been described with reference to a particular arrangement of parts, features, and like, these are not intended to exhaust all possible arrangements or features, and indeed many other embodiments, modifications, and variations may be ascertainable to those of skill in the art. Thus, it is to be understood that the invention may therefore be practiced otherwise than as specifically described above.

it is to be understood that a process, comprises of converting a portion of a semiconductor device into a soluble by-products, removing the by-products from the process chamber and preparing the etchant for the process chamber in real-time, can be widely applied in any suitable semiconductor processing involving a liquid solution, and not be restricted by the semiconductors, such as NAND or dielectric materials, such as silicon nitride, removal embodiments described in this invention purely as examples.

What is claimed is:

1. A method for removing materials from a semiconductor device structure, comprising:
   introducing an etchant into a processing chamber to remove a portion of the semiconductor device structure and generating a by-product;
   converting the by-product into a precipitate by supplying a precipitation accelerator to the etchant, and the precipitation accelerator comprises a solid structure for the by-product to precipitate on, wherein the solid structure comprises silicates; and
   removing the precipitate by filtering out the precipitate, thereby removing the by-product continuously.

2. The method of claim 1, wherein the etchant comprises a phosphoric acid-containing solution.

3. The method of claim 1, wherein the semiconductor device structure is a 3D structure comprising alternately stacked silicon nitride layers and silicon dioxide layers, and the portion of the semiconductor device structure comprises silicon nitride.

4. The method of claim 3, wherein the 3D structure comprises holes extending through the alternately stacked silicon nitride layers and silicon dioxide layers, wherein during exposing the semiconductor device structure to the etchant, the etchant enters the holes and removes each of the silicon nitride layers.

5. The method of claim 1, further comprising: reintroducing the etchant to the process chamber after the precipitate is removed from the etchant.

6. The method of claim 1, wherein the solid structure is a molecular sieve.

7. A method for removing a material from a semiconductor device structure, comprising:
   exposing a semiconductor device structure to a solution exhibiting a positive etch selectivity for the material; and
   removing the material chemically from the semiconductor device structure in such a way that the solution exhibits negative etch selectivity for silicon oxide;
   converting the material to a by-product;
   converting the by-product to a precipitate by supplying a precipitation accelerator to the solution, and the precipitation accelerator comprises a solid structure for the by-product to precipitate on, wherein the solid structure comprises silicates; and
   monitoring composition of the solution in real time.

8. The method of claim 7, wherein the semiconductor device structure is a 3D structure comprising alternately stacked silicon nitride layers and silicon dioxide layers, and the material comprises silicon nitride.

9. The method of claim 8, wherein the 3D structure comprises holes extending through the alternately stacked silicon nitride layers and silicon dioxide layers, wherein during exposing the semiconductor device structure to the solution, the solution enters the holes and removes each of the silicon nitride layers.

10. The method of claim 7, further comprising removing the precipitate from the solution.

11. The method of claim 10, further comprising recycling the solution after the precipitate is removed from the solution.

12. The method of claim 7, wherein the solid structure is a molecular sieve.

* * * * *